United States Patent
Chiu

(10) Patent No.: US 6,703,250 B2
(45) Date of Patent: Mar. 9, 2004

(54) METHOD OF CONTROLLING PLASMA ETCH PROCESS

(75) Inventor: Hsien-Kuang Chiu, Taoyuan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/076,665

(22) Filed: Feb. 14, 2002

(65) Prior Publication Data

US 2003/0153102 A1 Aug. 14, 2003

(51) Int. Cl.$^7$ ............................................... H01L 21/00
(52) U.S. Cl. ..................... 438/9; 438/5; 438/7; 438/8; 438/14; 438/16; 216/58; 216/59; 216/60; 216/61
(58) Field of Search ....................... 438/5, 7–9, 14, 438/16; 216/58–61

(56) References Cited

U.S. PATENT DOCUMENTS

| | | | | |
|---|---|---|---|---|
| 4,859,277 A | * | 8/1989 | Barna et al. ................... 438/7 |
| 5,288,367 A | * | 2/1994 | Angell et al. .................. 216/60 |
| 5,308,414 A | * | 5/1994 | O'Neill et al. ................. 216/60 |
| 5,658,423 A | * | 8/1997 | Angell et al. .................... 438/9 |
| 5,770,097 A | * | 6/1998 | O'Neill et al. ................. 216/60 |
| 6,238,937 B1 | * | 5/2001 | Toprac et al. ................... 438/9 |
| 6,340,603 B1 | * | 1/2002 | Bell ................................ 438/9 |

* cited by examiner

Primary Examiner—John B. Vigushin
Assistant Examiner—Lisa Kilday
(74) Attorney, Agent, or Firm—Tung & Associates

(57) ABSTRACT

A method for automated monitoring and controlling of a semiconductor wafer plasma etching process including collecting data versus time during a plasma etching process the data including information representative of a concentration of at least one pair of reactant and product species present during the course of the plasma etching process; calculating a selected ratio of at least one reactant species and one product species at selected time intervals in the plasma etching process to create real-time concentration ratio data; retrieving model concentration ratio data for the at least one reactant species and one product species for comparison with the real-time concentration ratio data; comparing the model concentration ratio data with the real-time concentration ratio data to determine a difference; and, adjusting at least one plasma process operating parameter to minimize the difference.

17 Claims, 2 Drawing Sheets

METHOD OF CONTROLLING PLASMA ETCH PROCESS

FIELD OF THE INVENTION

This invention generally relates to plasma etching and more particularly to a method for real-time monitoring of reactant-product concentration ratios including in-situ adjustment of etching parameters.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers may be accomplished using various fabrication techniques including oxidation, implantation, deposition, epitaxial growth of silicon, lithography, etching, and planarization.

One important etching procedure for forming semiconductor features includes reactive ion etching (RIE) performed by a plasma of reactive ions. In the field of plasma etching, optical emission spectroscopy (OES) has been widely used for end-point detection by monitoring the intensity of wavelengths of either reactive species or etch products. More specifically, during an RIE process, plasma discharge materials, such as etchant, neutral, and reactive ions in the plasma, are continuously excited by electrons and collisions, giving off emissions ranging from ultraviolet to infrared radiation. An optical emission spectrometer diffracts this light into its component wavelengths and determines the intensity at a particular wavelength. Since each species emits light at a wavelength characteristic only of that species, it is possible to associate a certain wavelength with a particular species, and to use this information to detect an etching endpoint.

Also useful for monitoring reactants and products in a plasma etching process includes mass spectroscopy, where a molecule is broken into fragments and then analyzed typically using a magnetic field to determine the mass of the constituent fragments.

In forming a feature in a layer of material in a multilayer semiconductor device, one will typically etch away one type of material included in one layer of the device until another different layer of material which typically has a low selectivity to etching is reached, for example, an etch stop layer. Since the etch stop layer is typically a different material having a low reactivity with the reactive ion species, a discernible change in either or both the concentration of reactive ion species and the reactively etched species may be easily observed. Since the concentration of given plasma species is proportional to an emitted wavelength of light, the concentration of a given species may be tracked by monitoring the intensity at a given wavelength.

One problem with end-point detection using OES or any other concentration monitoring method occurs where no change in material such as a material interface is present during the etching process thereby providing no readily discernable change in reactive species or reactively etched (product) species. However, there are several applications where no material interface is present yet a known feature etching depth, for example, a trench or via etching depth into a monolithic substrate, for example, silicon or dielectric material, is required.

For example, FIGS. 1A and 1B show exemplary semiconductor features where an etching depth into a monolithic material is required, yet not material interface is present to detect an end point. FIG 1A shows typical shallow trench isolation features (STI) e.g., 12A, 12B, etched into a silicon oxide containing material layer 14, for example a low-k carbon doped oxide. FIG. 1B, shows typical dual damascene structures where an etching stop layer is not included at the interface of the via opening e.g., 16A, 16B and the trench opening e.g., 18A, 10B. Although there are several approaches to etching a dual damascene structure, the structure in FIG 1B for example, may be made by first etching the via opening e.g., 16A, and then etching the trench line opening e.g., 18A into dielectric layer 20 overlying the via opening e.g., 16A by a two step photolithographic patterning process. In both of these cases no material interface is present yet, a known etching depth is critical to successful device performance.

Several approaches have been proposed to overcome the lack of a clearly discernible material interface including tracking the amount of either or both reactants and plasma etching product species during the etching process. For example, statistical techniques of the prior art including typically single out one or more individual plasma species components to monitor, the selection of the components determined by statistical analysis of previous etching procedures. In general, the prior art methods use OES to monitor one or more individually selected wavelengths of plasma species together with a statistical analysis of the results of the optical spectrum of a product produced or reactive ion species consumed. In this regard reference is made to U.S. Pat. Nos. 5,288,367, 5,658,423, and 6,238,937, which are incorporated herein by reference.

One problem with this approach includes the several assumptions involved in performing multi-variant statistical analyses, for example, selecting the number and type of components to be monitored in a principal components analysis (PCA). For example, the number and type of analyzed components may change when the pattern density to be etched changes although the material and the desired etch depth and profile remain the same. For example, FIGS. 1C and 1D show an exemplary increased density in an etching pattern, for example STI features 12A, 12B, 12C and dual damascene features 16A–C, 18A–C compared to FIGS. 1A and 1B, respectively. With an increased etching pattern density, which may change from device to device, the corresponding ratio of masked to unmasked etching areas change thereby altering expected behaviors of etching products and reactants. As the density of patterns to be etched varies from application to application, a ratio of masked material to unmasked material likewise varies with the various depths and profiles thus altering expected concentrations of both reactive species and etch products over time and making, for example, the selection of the number and type of components in a PCA analysis a complicated process.

In addition, the prior art method of comparing individually monitored components to previous etching processes increases at an exponential rate given the large number of variable parameters including pattern etching densities. Such methods have proven to be difficult to implement in real-time processing systems given the large number of variable parameters.

Another problem are the various plasma etching apparatus available for use, each of the etching apparatus having different behaviors in terms of species concentration evolution over time. For example, the use of high-density, inductively-coupled plasma ICP) or cyclotron resonance (ECR), differ from conventional RIE in plasma formation causing significant differences in plasma behavior. Consequently, models developed for one process according to prior art statistical analysis methods are likely restricted to a particular etching process.

These and other shortcomings demonstrate a need in the semiconductor processing art to develop an improved method and system for monitoring an etching process including real-time analysis and feedback to alter in-situ etching parameters to improve a plasma etching process.

It is therefore an object of the invention to develop an improved method and system for monitoring an etching process including real-time analysis and feedback to alter in-situ etching parameters to improve a plasma etching process while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for automated monitoring and controlling of a semiconductor wafer plasma etching process.

In one embodiment, the method includes collecting data versus time during a plasma etching process said data including information representative of a concentration of at least one pair of reactant and product species present during the course of the plasma etching process; calculating a selected ratio of at least one reactant species and one product species at selected time intervals in the plasma etching process to create real-time reactant-product ratio data; retrieving pre-determined reactant-product ratio data for the at least one reactant species and one product species for comparison with the real-time reactant-product ratio data; comparing the pre-determined reactant-product ratio data with the real-time reactant-product ratio data to determine a difference; and, adjusting at least one plasma process operating parameter to minimize the difference.

In related embodiments, the step of collecting data is performed according to at least one of optical emission spectroscopy and mass spectroscopy.

In another embodiment, the pre-determined reactant-product ratio data is generated according to at least one of calculation or archival of model data. Further, the pre-determined reactant-product ratio data is generated at least in part according to a ratio of masked to unmasked etching area exposed to the etching process.

In other related embodiments, the steps of collecting, calculating, comparing, and adjusting are carried out with a means for automating said steps. Further, the step of adjusting includes selectively adjusting at least one of an etching time, excitation power, gas flow rate, pressure, semiconductor wafer temperature, and semiconductor wafer bias. Further yet, the plasma etching process includes etching semiconductor features including at least one of shallow trench isolation features, vias, and trench lines. Yet further, the plasma etching process includes etching at least one of silicon oxide containing materials, metal nitride containing materials, silicon containing materials, metal containing materials, and organic polymer containing materials.

In other related embodiments, determining a difference includes a non-linear least squares analysis. Further, the step of calculating a selected ratio includes the use of Principal Component Analysis. Further yet, the step of selectively adjusting further includes multi-variant analysis to determine which parameters to adjust.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
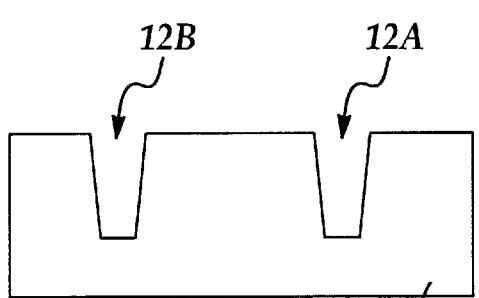
FIGS. 1A–1D are cross sectional side view representations of exemplary semiconductor features according to the prior art.
Figure 1B:
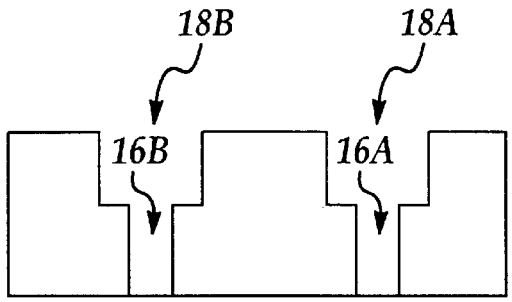
Figure 1C:
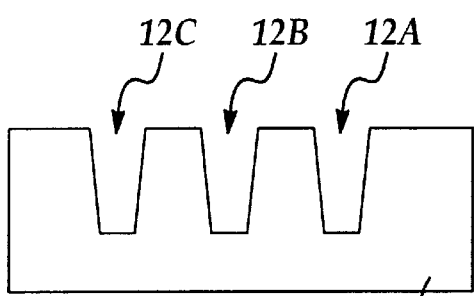
Figure 1D:
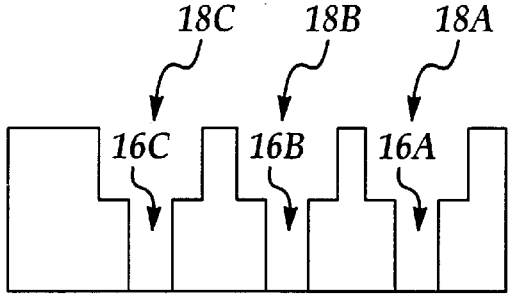

In the method according to the present invention, although the figures make reference to optical emission spectra, it will be appreciated that the method of the present invention may be used with any monitoring system capable of tracking a concentration of reactant and product species in an etching process. For example, mass spectroscopy which monitors an intensity of mass separated components over a spectrum of mass values may be suitably used with the method of the present invention. Preferably, the monitoring system for tracking reactant and product species is able to collect and store spectra of data collected over short time intervals. Preferably, the monitoring system is equipped with a computer processing system (controller) to control the collection, storage, presentation, and calculation of relationships with respect to the spectra of data. In addition, the monitoring system is preferably equipped with a control interface to output control signal to a plasma reactor etching system to control operating parameters, for example, selection of gaseous species by controlling gas feed valves, gas flow rates and selection of plasma operating parameters such as RF power, biasing power, and the like.

It has been found according to the present invention, that statistical analysis and the number of model etching calibrations needed is greatly reduced according to the present invention. Thus, according to one embodiment of the present invention, the concentration of at least one reactant and one product is monitored during a plasma etching process and the ratio of the concentration at least one reactant and one product calculated to determine a reactant-product concentration ratio. Further, according to the present invention, the reactant-product ratio is compared to a pre-determined reactant-product ratio, the etching parameters being adjusted in-situ to approach the pre-determined reactant-product ratio.

According to the present invention, monitoring a ratio of reactants and products reduces the number of variable parameters present that may affect concentrations present when, for example, monitoring individual plasma components. Particularly in the case where materials and etching parameters are otherwise constant, variations in plasma components due to variations in etching pattern density is more readily accounted for by applying a calculated correction factor, arrived at, for example, by determining a ratio of masked to unmasked area to be etched.

In one embodiment, the pre-determined reactant-product ratio is calculated based on known parameters such as the ratio of masked area to unmasked area to be etched. In another embodiment, the pre-determined reactant-product ratio is determined from previously collected (archived) model data for a comparable density of etched features and material. In another embodiment, a correction factor is calculated based on the ratio of masked area to unmasked area to be etched and applied to the pre-determined model reactant-product ratio for etching the same feature and the same material but with a different pattern density.

For example, generally, for a etching pattern density with a smaller area exposed for etching, a relatively lower concentration of etching products compared to reactant etch species would be expected thereby allowing application of a correction factor determined by known statistical methods applied to selected principal components, however, where the principle components include one or more ratios of reactant-product.

The reactant-product concentration ratio over time may be calculated using known statistical methods including a known etching pattern density or may be generated by a model etching procedure where a similar, preferably substantially identical pattern density with the same materials is successfully etched. In this respect, spectra, or at least selected ratios of reactant-product components of the spectra of successful (model) etching procedures are preferably stored together with etching operating parameters such that during an etching procedure a real time comparison is performed between selected component ratios of the real-time data and the model data. Having preferably begun the etching process using pre-determined model etching parameters, such as RF power, bias, gas feed rate, pressure, and the like, selected etching parameters are adjusted in-situ in a predetermined order to approximate the model etching spectra.

In operation, for example, a comparison of selected reactant-product ratios of real-time data to the model data is made and the gas flow rate altered by a predetermined amount. The accompanying change, if any, in selected real-time reactant-product ratios is then analyzed to determine if the model data is being approached by an acceptable amount. The analysis may proceed by known statistical methods including non-linear least squares and multi-variant analysis, with the provision, however, that selected variables include reactant-product ratios according to the present invention. Preferably, an algorithm is provided whereby a decision is then made according to a pre-determined decision tree to alter the same processing parameter, for example, a gas flow rate by another predetermined amount, or to alter a second parameter, for example, the RF power by a predetermined amount. Thus, an iterative comparison of selected reactant-product ratios of the real-time spectra to the model spectra is made and etching parameters altered according to a predetermined decision tree to allow the real-time spectra to approach the model spectra.

Figure 2:
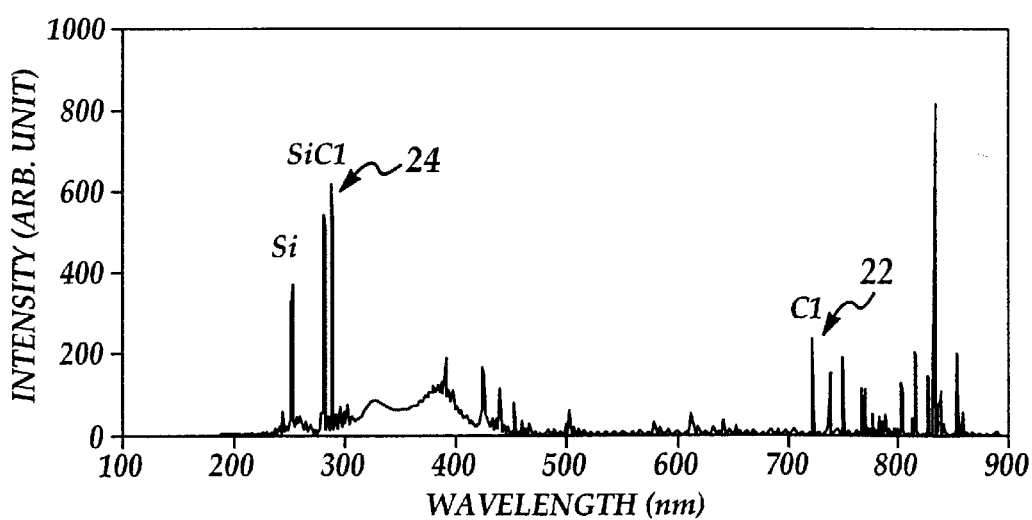
FIG. 2 is an exemplary Optical Emission Spectrum used according to one embodiment according to the present invention.

For example, referring to FIG. 2 is shown an exemplary OES spectrum at a particular point in time during an etching process where the emission wavelength is on the horizontal axis and the relative intensity is shown on the vertical axis. In an exemplary trench etching process using conventional chemistries including $Cl_2$, HBr, and $O_2$ to etch a silicon substrate, a reactant species, e.g., Cl, shown at peak 22 and a product species, e.g., SiCl shown at peak 24 are selected components for monitoring and either archiving the raw data for later calculation of a reactant-product ratio or the ratio of reactant to product. Preferably the raw data is archived allowing corrections or manipulation of the raw data at a later time. It will be appreciated that according to the present invention a product-reactant ratio may be used as well as long as the same ratios are compared in a subsequent analysis.

Figure 3:
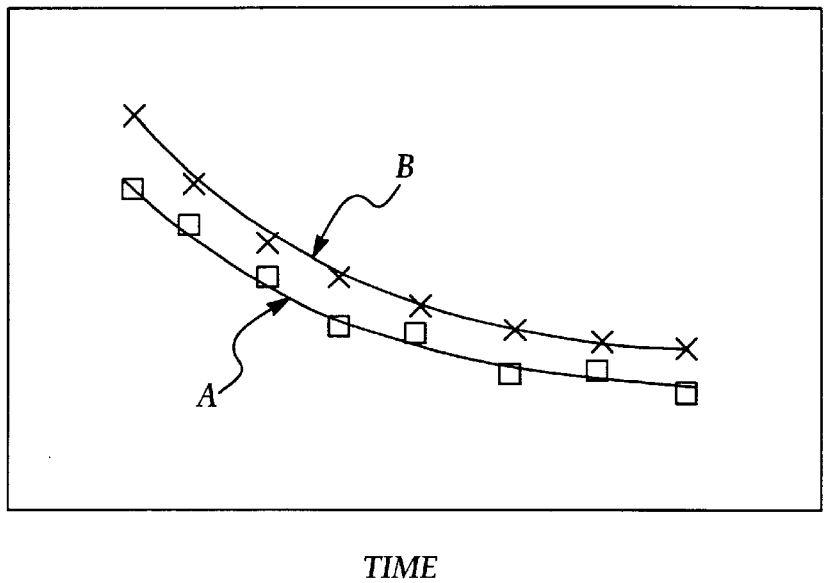
FIG. 3 is an exemplary data plot of a Reactant-Product ratio versus time in a plasma etching process according to the present invention.

According to the present invention, a ratio of at least one reactant to product is calculated from data proportional to species concentration, for example intensity in an OES monitoring process, and monitored over an etching time period. For example, FIG. 3 shows an exemplary representation of a reactant-product ratio on the vertical axis (units are arbitrary) versus time (e.g., seconds) on the horizontal axis. Line A represents the evolution of the real time selected reactant-product ratio data and line B represents model reactant-product ratio data previously collected. A difference between the model data (line B) and the real-time data (line A) is determined as input to an etching parameter adjustment algorithm for subsequent etching parameter adjustment including adjusting an etching time.

Figure 4:
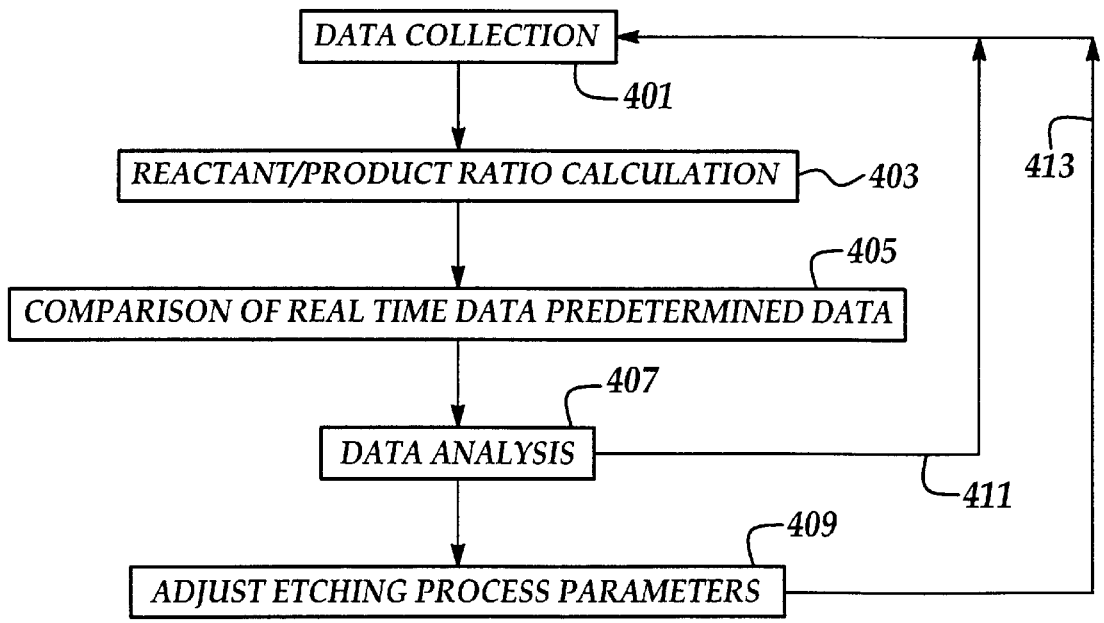
FIG. 4 is a process flow diagram according to different embodiments of the present invention.

In one exemplary embodiment of the present invention, for example referring to the process diagram in FIG. 4, data (spectra) are collected at selected time intervals according to step 401; a ratio of one or more reactant product pair (at a particular time) is then calculated according to step 403; the reactant-product ratio data is then compared to a pre-determined reactant-product ratio and a difference calculated according to step 405; the difference or error is then forwarded to a controlling system in step 407 where an algorithm having a predetermined decision tree is implemented to determine which and by what amount a processing parameter is altered with the goal of minimizing the differences with respect to the model data; one or more commands to adjust one or more etching processing parameters are then output according to step 409 to adjust one or more etching parameters. Although the steps are shown as conducted in series, the slower processing step of adjusting plasma processing parameters 409 may take place after several pre-determined iterations of the previous steps 401–407 as indicated by directional process line 411. The process steps 401 through 409 are then repeated as indicated by directional process line 413 for a pre-determined time or until a pre-determined reactant-product ratio is reached.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for automated monitoring and controlling of a semiconductor wafer plasma etching process comprising the steps of:

collecting data versus time according to at least one of optical emission spectroscopy and mass spectroscopy during a plasma etching process said data representative of a concentration of at least one reactant and one product species present during the course of the plasma etching process;

calculating a concentration ratio comprising the at least one reactant species and one product species at selected time intervals during the plasma etching process to create real-time concentration ratio data;

retrieving model concentration ratio data determined according to a model etching process for the at least one reactant species and one product species;

comparing the model concentration ratio data with the real-time concentration ratio data; and, adjusting in-situ at least one plasma process operating parameter in response to the real-time concentration ratio to approach the model reactant-product concentration ratio.

2. The method of claim 1, wherein the model concentration ratio data is generated by applying a correction factor according to a ratio of masked to unmasked etching area exposed to the plasma etching process.

3. The method of claim 1, wherein the step of adjusting includes selectively adjusting the at least one plasma process operating parameter selected from the group consisting of etching time, excitation power, gas flow rate, pressure, semiconductor wafer temperature, and semiconductor wafer bias.

4. The method of claim 1, wherein the plasma etching process comprises etching semiconductor features including at least one of shallow trench isolation features, vias, and trench lines.

5. The method of claim 1, wherein the plasma etching process comprises etching materials selected from the group consisting of silicon oxides, metal nitrides, silicon, metals, and organic polymers.

6. The method of claim 1, wherein the step of adjusting further includes multi-variant analysis.

7. A method for automated monitoring and controlling of a semiconductor wafer plasma etching process independently of an etching pattern density comprising the steps of:

determining concentration versus time during a plasma etching process of at least one reactant and one product species present during the plasma etching process according to at least one of optical emission spectroscopy and mass spectroscopy;

calculating a concentration ratio selected from the group consisting of a reactant-product ratio and product-reactant ratio of the at least one reactant species and one product species at selected time intervals during the plasma etching process to determine real-time concentration ratio data;

retrieving model concentration ratio data comprising the at least one reactant species and one product species to determine a desired concentration ratio;

comparing the model concentration ratio data with the real-time concentration ratio data to determine a desired concentration ratio; and, selectively adjusting at least one plasma process operating parameter in-situ to approach the desired concentration ratio.

8. The method of claim 7, wherein the desired concentration ratio data is determined with respect to a ratio of masked to unmasked etching area exposed to the plasma etching process.

9. The method of claim 7, wherein the step of selectively adjusting includes adjusting a plasma operating parameter selected from the group consisting of an etching time, excitation power, gas flow rate, pressure, semiconductor wafer temperature, and semiconductor wafer bias.

10. The method of claim 7, wherein the plasma etching process comprises etching semiconductor features selected from the group consisting of shallow trench isolation features, vias, and trench lines.

11. The method of claim 7, wherein the plasma etching process comprises etching materials selected from the group consisting of silicon oxide containing materials, metal nitride containing materials, silicon containing materials, metal containing materials, and organic polymer containing materials.

12. The method of claim 1, wherein the step of comparing comprises determining a concentration ratio difference between the model reactant-product concentration ratio data and the real-time reactant-product concentration ratio data.

13. The method of claim 12, wherein the step of adjusting comprises adjusting to minimize the concentration ratio difference.

14. The method of claim 1, wherein the etching process comprises etching a silicon substrate.

15. The method of claim 14, wherein an etching chemistry comprises $Cl_2$, HBr, and $O_2$.

16. The method of claim 15, wherein the reactant comprises Cl and the product comprises SiCl.

17. The method of claim 1, wherein the concentration ratio data and model concentration ratio data are selected from the group consisting of a reactant-product ratio and a product-reactant ratio.

\* \* \* \* \*